United States Patent
Lim (10) Patent No.: US 12,013,441 B2
(45) Date of Patent: Jun. 18, 2024

(54) APPARATUS AND METHOD FOR DETERMINING WHETHER BATTERY CELL HAS PASSED

(71) Applicant: LG ENERGY SOLUTION, LTD., Seoul (KR)

(72) Inventor: Bo Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 180 days.

(21) Appl. No.: 17/637,155

(22) PCT Filed: Aug. 18, 2020

(86) PCT No.: PCT/KR2020/010998
§ 371 (c)(1),
(2) Date: Feb. 22, 2022

(87) PCT Pub. No.: WO2021/040307
PCT Pub. Date: Mar. 4, 2021

(65) Prior Publication Data
US 2022/0283233 A1 Sep. 8, 2022

(30) Foreign Application Priority Data
Aug. 23, 2019 (KR) ........................ 10-2019-0103876

(51) Int. Cl.
*G01R 31/387* (2019.01)
*H02J 7/00* (2006.01)

(52) U.S. Cl.
CPC .......... *G01R 31/387* (2019.01); *H02J 7/0047* (2013.01); *H02J 7/0068* (2013.01)

(58) Field of Classification Search
None
See application file for complete search history.

(56) References Cited

U.S. PATENT DOCUMENTS

| 7,545,146 B2 | 6/2009 | Klang et al. | |
| 2003/0054229 A1* | 3/2003 | Odaohhara | G01R 31/374 |
| | | | 429/61 |

(Continued)

FOREIGN PATENT DOCUMENTS

| CA | 3 044 785 A1 | 6/2018 |
| CN | 102012487 A | 4/2011 |

(Continued)

OTHER PUBLICATIONS

International Search Report for PCT/KR2020/010998 mailed on Nov. 19, 2020.

(Continued)

*Primary Examiner* — Jas A Sanghera
(74) *Attorney, Agent, or Firm* — Birch, Stewart, Kolasch & Birch, LLP (57) ABSTRACT

A battery cell pass determination apparatus and a battery cell pass determination method involving verifying, after the battery cell is manufactured, whether the capacity of the battery cell repeatedly charged and discharged for a predetermined number of times satisfies a predetermined reference capacity, that is, determining whether a battery cell is a pass without having to charge and discharge a battery for 300 times, so that it is possible to quickly determine whether the battery cell is a pass.

8 Claims, 5 Drawing Sheets

(56) References Cited

U.S. PATENT DOCUMENTS

| | | |
|---|---|---|
| 2006/0261782 A1 | 11/2006 | Kim et al. |
| 2008/0094031 A1 | 4/2008 | Singh et al. |
| 2010/0264929 A1 | 10/2010 | Ugaji et al. |
| 2013/0166233 A1 | 6/2013 | Suh et al. |
| 2016/0252586 A1 | 9/2016 | Shimura et al. |
| 2017/0176543 A1 | 6/2017 | Lee et al. |
| 2018/0198161 A1 | 7/2018 | Krasovitsky et al. |
| 2019/0198938 A1 | 6/2019 | Fujita et al. |

FOREIGN PATENT DOCUMENTS

| | | |
|---|---|---|
| EP | 2 645 115 A1 | 10/2013 |
| JP | 2003-92838 A | 3/2003 |
| JP | 2008-538608 A | 10/2008 |
| JP | 2012-154839 A | 8/2012 |
| JP | WO2014/122831 A1 | 8/2014 |
| JP | 2019-57382 A | 4/2019 |
| JP | 6494840 B1 | 4/2019 |
| KR | 10-1999-0039187 A | 6/1999 |
| KR | 10-2006-0116724 A | 11/2006 |
| KR | 10-1097586 B1 | 12/2011 |
| KR | 10-1227951 B1 | 1/2013 |
| KR | 10-2013-0073802 A | 7/2013 |
| KR | 10-1440719 B1 | 9/2014 |
| KR | 10-2015-0045600 A | 4/2015 |
| KR | 10-1952565 B1 | 2/2019 |
| KR | 10-2009636 B1 | 8/2019 |

OTHER PUBLICATIONS

Extended European Search Report for European Patent Application No. 20857959.9 dated Jul. 25, 2022.

* cited by examiner

APPARATUS AND METHOD FOR DETERMINING WHETHER BATTERY CELL HAS PASSED

TECHNICAL FIELD

The present disclosure relates to an apparatus and a method for determining whether a battery cell is a pass by predicting the capacity of the battery cell.

BACKGROUND ART

A battery is widely used as a power source in a mobile terminal, which is represented by a mobile phone. Recently, with growing interests in environmental protection, renewable energy such as solar power or wind power is attracting attention, and batteries have been popularized as a use for storing the energy. Hybrid vehicles or electric vehicles equipped with batteries are becoming popular as automobiles.

Meanwhile, after such a battery is manufactured, a capacity verification process is performed to confirm whether the battery cell has been manufactured to satisfy a predetermined reference capacity.

A typical method for verifying the capacity of a battery cell is to check whether the battery cell has been manufactured to satisfy a reference capacity through running a high-temperature, high-rate test (fully charge-complete discharge cycle) on the battery cell for 300 times.

Such a typical method has a limitation in that it takes about more than 750 hours because a full-charge-complete-discharge cycle needs to be performed on a battery cell for 300 times.

Therefore, the present disclosure proposes an apparatus and a method which are capable of performing a method for verifying a battery cell faster than the typical method.
(Patent Document 0001) Korean Patent Laid-Open Publication KR 1440719 B1.

DISCLOSURE OF THE INVENTION

Technical Problem

The present disclosure provides an apparatus and a method capable of performing the capacity verification of a battery cell faster.

The present disclosure also provides an apparatus and a method capable of quickly performing the capacity verification of a battery cell according to a desired reliability.

Technical Solution

In accordance with an exemplary embodiment, a battery cell pass determination apparatus includes a battery cell mounting part on which a battery cell to be determined for battery cell pass is mounted, a charge/discharge module which charges and discharges the battery cell, and a battery cell pass determination unit which determines whether the battery cell is a pass, wherein the battery cell pass determination unit includes a capacity derivation unit which derives a capacity value (capacity (t)) of the battery cell for each cycle while performing a full charge-complete discharge cycle of the battery cell, a capacity increase value calculation unit which calculates a capacity increase value from the derived capacity value for each cycle, and a judgment unit which judges battery cell pass on the basis of the calculated capacity increase value.

The judgment unit may determine that the battery cell is the pass when the calculated capacity increase value is greater than a predetermined reference capacity value.

The predetermined reference capacity value may be a value corresponding to a predetermined reliability for a cell-pass capacity value after a predetermined full charge-complete discharge cycle is performed.

In accordance with another exemplary embodiment, a battery cell pass determination apparatus includes a battery cell mounting part on which a battery cell to be determined for battery cell pass is mounted, a charge/discharge module which charges and discharges the battery cell, and a battery cell pass determination unit which determines whether the battery cell is a pass, wherein the battery cell pass determination unit includes a capacity derivation unit which derives a capacity value (capacity (t)) of the battery cell for each cycle while performing a full charge-complete discharge cycle of the battery cell, a count unit which counts the number of full charge-complete discharge cycles in which the capacity value of the battery cell in each cycle derived by the capacity derivation unit becomes equal to or less than an initial capacity (capacity (l)) of the battery cell derived after performing an initial full charge-complete discharge cycle, and a judgment unit which judges battery cell pass on the basis of a count number of full charge-complete discharge cycles in which the capacity value of the battery cell in each cycle derived by the capacity derivation unit becomes equal to or less than the initial capacity (capacity (l)) of the battery cell derived after performing an initial full charge-complete discharge cycle.

The judgment unit may determine that the battery cell is the pass when the count number of full charge-complete discharge cycles in which the capacity value of the battery cell in each cycle derived by the capacity derivation unit becomes equal to or less than the initial capacity (capacity (l)) of the battery cell derived after performing the initial full charge-complete discharge cycle is greater than a reference number of times.

The reference number of times may be a value corresponding to a predetermined reliability for a cell-pass capacity value after a predetermined full charge-complete discharge cycle is performed.

In accordance with yet another exemplary embodiment, a battery cell pass determination apparatus includes a battery cell mounting part on which a battery cell to be determined for battery cell pass is mounted, a charge/discharge module which charges and discharges the battery cell, and a battery cell pass determination unit which determines whether the battery cell is a pass, wherein the battery cell pass determination unit includes a capacity derivation unit which derives a capacity value (capacity (t)) of the battery cell for each cycle while performing a full charge-complete discharge cycle of the battery cell, a capacity increase value calculation unit which calculates a capacity increase value from the derived capacity value for each cycle, a count unit which counts the number of full charge-complete discharge cycles in which the capacity value of the battery cell in each cycle derived by the capacity derivation unit becomes equal to or less than an initial capacity (capacity (l)) of the battery cell derived after performing an initial full charge-complete discharge cycle, and a judgment unit which judges battery cell pass on the basis of a count number of full charge-complete discharge cycles in which the capacity value of the battery cell in each cycle derived by the capacity derivation unit becomes equal to or less than the initial capacity (capacity (l)) of the battery cell derived after performing an initial full charge-complete discharge cycle.

The judgment unit may determine that the battery cell is the pass when the calculated capacity increase value is greater than a predetermined reference capacity value and at the same time, the count number of full charge-complete discharge cycles in which the capacity value of the battery cell in each cycle derived by the capacity derivation unit becomes equal to or less than the initial capacity (capacity (l)) of the battery cell derived after performing the initial full charge-complete discharge cycle is greater than a reference number of times.

The predetermined reference capacity value may be a value corresponding to a predetermined reliability for a cell-pass capacity value after a predetermined full charge-complete discharge cycle is performed, and the reference number of times may be a value corresponding to a predetermined reliability for a cell-pass capacity value after a predetermined full charge-complete discharge cycle is performed.

In accordance with an exemplary embodiment, a battery cell pass determination method includes a battery cell connection step of connecting a battery cell to be determined for battery cell pass to a battery cell pass determination apparatus, a full charge-complete discharge cycle performance step of repeatedly performing a full charge-complete discharge cycle on the battery cell, a capacity value per cycle derivation step of deriving a capacity value (capacity (t)) of the battery cell for each cycle while performing the full charge-complete discharge cycle, a capacity increase value calculation step of calculating a capacity increase value from the derived capacity value for each cycle, and a judgment step of judging battery cell pass on the basis of the calculated capacity increase value.

The judgment step may determine that the battery cell is the pass when the calculated capacity increase value is greater than a predetermined reference capacity value.

The predetermined reference capacity value may be a value corresponding to a predetermined reliability for a cell-pass capacity value after a predetermined full charge-complete discharge cycle is performed.

In accordance with another exemplary embodiment, a battery cell pass determination method includes a battery cell connection step of connecting a battery cell to be determined for battery cell pass to a battery cell pass determination apparatus, a full charge-complete discharge cycle performance step of repeatedly performing a full charge-complete discharge cycle on the battery cell, a capacity value per cycle derivation step of deriving a capacity value (capacity (t)) of the battery cell for each cycle while performing the full charge-complete discharge cycle, a count step of counting the number of full charge-complete discharge cycles in which the capacity value of the battery cell in each cycle derived from the capacity value per cycle derivation step becomes equal to or less than an initial capacity (capacity (l)) of the battery cell derived after performing an initial full charge-complete discharge cycle, and a judgment step of judging battery cell pass on the basis of a count number of full charge-complete discharge cycles in which the capacity value of the battery cell in each cycle derived from the capacity value per cycle derivation step becomes equal to or less than the initial capacity (capacity (l)) of the battery cell derived after performing the initial full charge-complete discharge cycle.

The judgment step may determine that the battery cell is the pass when the count number of full charge-complete discharge cycles in which the capacity value of the battery cell in each cycle derived from the capacity value per cycle derivation step becomes equal to or less than the initial capacity (capacity (l)) of the battery cell derived after performing the initial full charge-complete discharge cycle is greater than a reference number of times.

The reference number of times may be a value corresponding to a predetermined reliability for a cell-pass capacity value after a predetermined full charge-complete discharge cycle is performed.

In accordance with yet another exemplary embodiment, a battery cell pass determination method includes a battery cell connection step of connecting a battery cell to be determined for battery cell pass to a battery cell pass determination apparatus, a full charge-complete discharge cycle performance step of repeatedly performing a full charge-complete discharge cycle on the battery cell, a capacity value per cycle derivation step of deriving a capacity value (capacity (t)) of the battery cell for each cycle while performing the full charge-complete discharge cycle, a capacity increase value calculation step of calculating a capacity increase value from the derived capacity value per cycle, a count step of counting the number of full charge-complete discharge cycles in which the capacity value of the battery cell in each cycle derived from the capacity value per cycle derivation step becomes equal to or less than an initial capacity (capacity (l)) of the battery cell derived after performing an initial full charge-complete discharge cycle, and judgment steps and of judging battery cell pass on the basis of the calculated capacity increase value and a count number of full charge-complete discharge cycles in which the capacity value of the battery cell in each cycle derived from the capacity value per cycle derivation step becomes equal to or less than the initial capacity (capacity (l)) of the battery cell derived after performing the initial full charge-complete discharge cycle.

The judgment step may determine that the battery cell is the pass when the calculated capacity increase value is greater than a predetermined reference capacity value and at the same time, the count number of full charge-complete discharge cycles in which the capacity value of a battery cell in each cycle derived from the capacity value per cycle derivation step becomes equal to or less than the initial capacity (capacity (l)) of the battery cell derived after performing the initial full charge-complete discharge cycle is greater than a reference number of times.

The predetermined reference capacity value may be a value corresponding to a predetermined reliability for a cell-pass capacity value after a predetermined full charge-complete discharge cycle is performed, and the reference number of times may be a value corresponding to a predetermined reliability for a cell-pass capacity value after a predetermined full charge-complete discharge cycle is performed.

Advantageous Effects

According to the present invention, it is possible to determine whether a battery cell is a pass without having to charge and discharge a battery for 300 times.

In addition, according to the present invention, it is possible to quickly determine whether a battery cell is a pass.

MODE FOR CARRYING OUT THE INVENTION

Hereinafter, embodiments of the present invention will be described in detail with reference to the accompanying drawings so that those skilled in the art to which the present invention pertains may easily practice the embodiments. However, the present invention may be embodied in many different forms, and is not limited to the embodiments set forth herein. In addition, in order to clearly describe the present invention, parts irrelevant to the description are omitted in the drawings, and like reference numerals designate like elements throughout the specification.

1. Battery Cell Pass Determination Apparatus of the Present Invention

A battery cell pass determination apparatus 100 according to exemplary embodiments of the present invention is an apparatus which verifies, after a battery cell is manufactured, whether the capacity of the battery cell repeatedly charged and discharged for a predetermined number of times satisfies a predetermined reference capacity.

Figure 1:
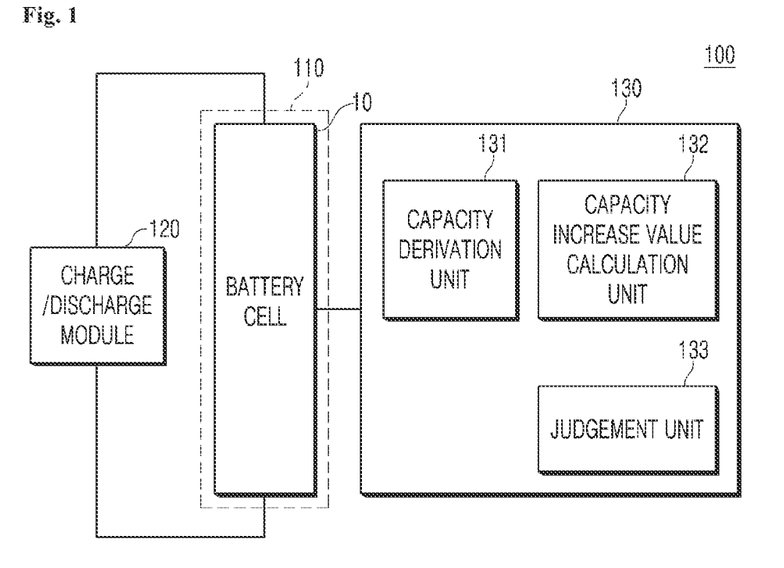
FIG. 1 is a view showing a battery cell pass determination apparatus in accordance with an exemplary embodiment.

1-1. Battery Cell Pass Determination Apparatus in Accordance with an Exemplary Embodiment FIG. 1 is a view showing the configuration of the battery cell pass determination apparatus 100 in accordance with an exemplary embodiment.

Hereinafter, with reference to FIG. 1, the battery cell pass determination apparatus 100 in accordance with an exemplary embodiment will be described.

The battery cell pass determination apparatus 100 in accordance with an exemplary embodiment includes a battery cell mounting part 110 on which a battery cell 10 to be determined for battery cell pass is mounted, a charge/discharge module 120 which charges and discharges the battery cell 10, and a battery cell pass determination unit 130 which determines whether the battery cell 10 is a pass.

Specifically, the battery cell mounting part 110 is a component which fixes the battery cell 10 to be determined for battery cell pass, and may be configured in various forms.

For example, the battery cell mounting part 110 may be configured in a jig form, and the battery cell 10 may be fixed on an upper portion of the jig.

Meanwhile, the charge/discharge module 120 may subject the battery cell 10 to full charge→rest for a predetermined time→complete discharge→rest for a predetermined time.

At this time, in a full charge process or a complete discharge process, the battery cell 10 may be charged or discharged to 1 CP (Constant Power).

Meanwhile, the battery cell pass determination unit 130 includes a capacity derivation unit 131 which derives a capacity value (capacity (t)) of the battery cell for each cycle while performing a full charge-complete discharge cycle of the battery cell, a capacity increase value calculation unit 132 which calculates a capacity increase value from the derived capacity value for each cycle, and a judgment unit 133 which judges battery cell pass on the basis of the calculated capacity increase value.

Meanwhile, the capacity value derivation unit 131 may derive the capacity of a battery cell using various techniques known in the art.

For example, the capacity value derivation unit 131 may derive the capacity of a battery cell on the basis of the open voltage of the battery cell, or may derive the capacity of a battery cell by calculating the amount of current used in a full charge-complete discharge cycle.

A capacity increase value calculated by the capacity increase value calculation unit 132 may be calculated through the following equation.

Capacity increase value=Capacity value per cycle (capacity($t$))−Initial capacity value (capacity($I$)) (Equation)

That is, a capacity increase value may be calculated by subtracting an initial capacity value from a capacity value per cycle derived after performing each cycle.

Meanwhile, the judgment unit 133 may determine that a corresponding battery cell is a pass when the calculated capacity increase value is greater than a predetermined reference capacity value, and may judge that the battery cell is defective when the calculated capacity increase value is equal to or less than the predetermined reference capacity value.

Meanwhile, the predetermined reference capacity value may be a value corresponding to a predetermined reliability for a cell-pass capacity value after a predetermined full charge-complete discharge cycle is performed.

For example, when the predetermined reference capacity value is set to 1.006, it may correspond to a reliability of 77% when compared to determining battery cell pass for a battery cell on which a predetermined full charge-complete discharge cycle has been performed for 300 times.

Figure 2:
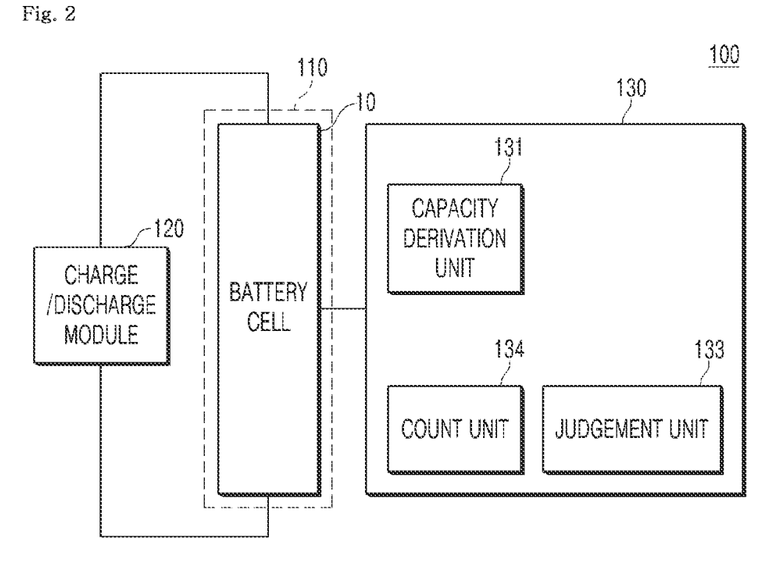
FIG. 2 is a view showing a battery cell pass determination apparatus in accordance with another exemplary embodiment.

1-2. Battery Cell Pass Determination Apparatus in Accordance with Another Exemplary Embodiment FIG. 2 is a view showing the configuration of the battery cell pass determination apparatus 100 in accordance with another exemplary embodiment.

Hereinafter, with reference to FIG. 2, the battery cell pass determination apparatus 100 in accordance with another exemplary embodiment will be described.

The battery cell pass determination apparatus 100 in accordance with another exemplary embodiment includes a battery cell mounting part 110 on which a battery cell 10 to be determined for battery cell pass is mounted, a charge/discharge module 120 which charges and discharges the battery cell 10, and a battery cell pass determination unit 130 which determines whether the battery cell 10 is a pass.

Since the battery cell mounting part 110 and the charge/discharge module 120 are the same as those of the battery cell pass determination apparatus 100 in accordance with an exemplary embodiment described above, detailed descriptions thereof will be omitted.

Meanwhile, the battery cell pass determination unit 130 may include a capacity derivation unit 131 which derives a capacity value (capacity (t)) of the battery cell for each cycle while performing a full charge-full discharge cycle of the battery cell, a count unit 134 which counts the number of full charge-complete discharge cycles in which the capacity of the battery cell with respect to an initial capacity capacity (l) becomes the initial capacity capacity (l) again, a judgment unit 133 which judges battery cell pass on the basis of a count number of full charge-complete discharge cycles in which the capacity value of the battery cell in each cycle derived by the capacity derivation unit 131 becomes equal to or less than the initial capacity (capacity (l)) of the battery cell derived after performing an initial full charge-complete discharge cycle.

For example, the count unit 134 may count the number of cycles where the derived capacity value per cycle becomes equal to or less than an initial capacity value in a process of performing a full charge-complete discharge cycle.

The judgment unit 133 may determine that a corresponding battery cell is a pass when the count number of full charge-complete discharge cycles in which the capacity value of the battery cell in each cycle derived by the capacity derivation unit 131 becomes equal to or less than the initial capacity (capacity (l)) of the battery cell derived after performing the initial full charge-complete discharge cycle is greater than a reference number of times.

Meanwhile, the reference number of times may be a value corresponding to a predetermined reliability for a cell-pass capacity value after a predetermined full charge-complete discharge cycle is performed.

For example, when the reference number of times is set to 50, it may correspond to a reliability of 83% when compared to determining battery cell pass for a battery cell on which a predetermined full charge-complete discharge cycle has been performed for 300 times.

Figure 3:
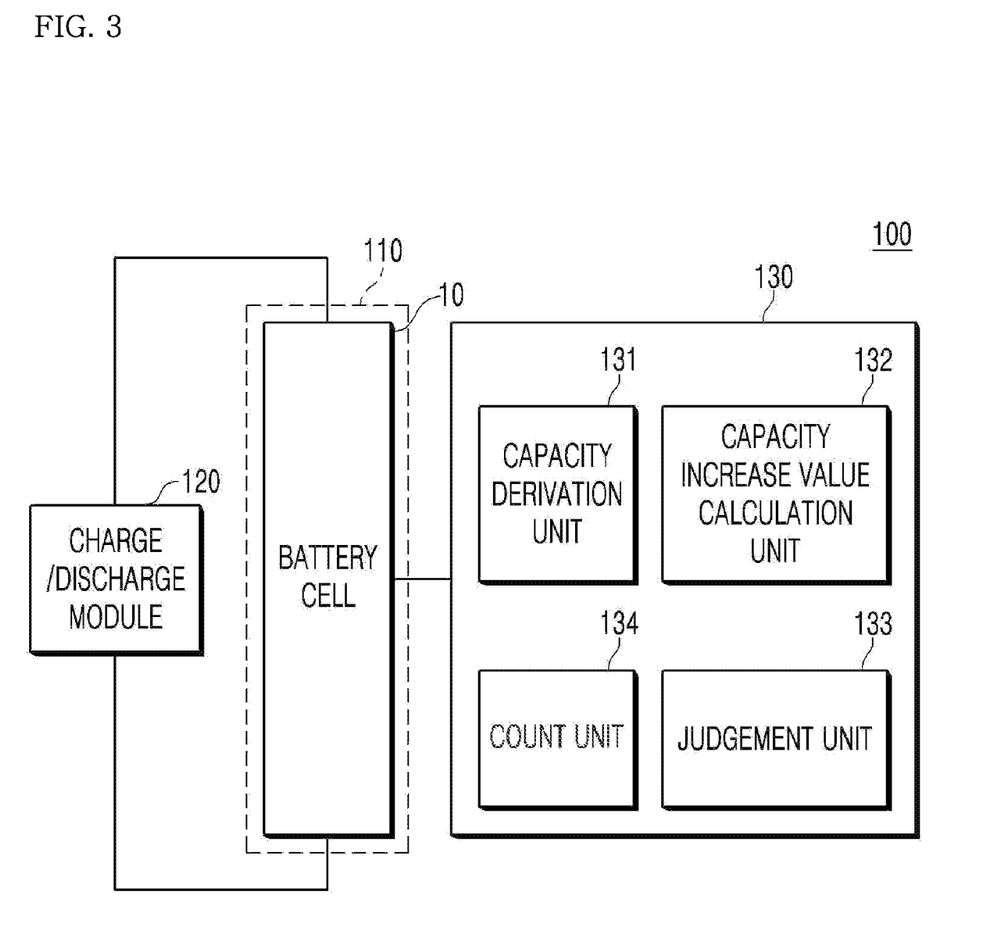
FIG. 3 is a view showing a battery cell pass determination apparatus in accordance with yet another exemplary embodiment.

1-3. Battery Cell Pass Determination Apparatus in Accordance with Yet Another Exemplary Embodiment FIG. 3 is a view showing the configuration of the battery cell pass determination apparatus 100 in accordance with yet another exemplary embodiment.

Hereinafter, with reference to FIG. 3, the battery cell pass determination apparatus 100 in accordance with yet another exemplary embodiment will be described.

The battery cell pass determination apparatus 100 in accordance with yet another exemplary embodiment includes a battery cell mounting part 110 on which a battery cell 10 to be determined for battery cell pass is mounted, a charge/discharge module 120 which charges and discharges the battery cell 10, and a battery cell pass determination unit 130 which determines whether the battery cell 10 is a pass.

Meanwhile, the battery cell pass determination unit 130 may include a capacity derivation unit 131 which derives a capacity value (capacity (t)) of the battery cell for each cycle while performing a full charge-full discharge cycle of the battery cell, a capacity increase value calculation unit 132 which calculates a capacity increase value from the derived capacity value for each cycle, a count unit 134 which counts the number of full charge-complete discharge cycles in which the capacity value of the battery cell in each cycle derived by the capacity derivation unit 131 becomes equal to or less than an initial capacity (capacity (l)) of the battery cell derived after performing an initial full charge-complete discharge cycle, and a judgment unit 133 which judges battery cell pass on the basis of the calculated capacity increase value and a count number of full charge-complete discharge cycles in which the capacity value of the battery cell in each cycle derived by the capacity derivation unit 131 become equal to or less than the initial capacity (capacity (l)) of the battery cell derived after performing the initial full charge-complete discharge cycle.

Meanwhile, the operation of each of the battery cell mounting part 110, the charge/discharge module 120, the capacity derivation unit 131, the capacity increase value calculation unit 134 is the same as the operation of each component described with reference to the battery cell pass determination apparatus in accordance with an exemplary embodiment and the battery cell pass determination apparatus in accordance with another exemplary embodiment described above, and thus, detailed descriptions thereof will be omitted.

Meanwhile, the judgment unit 133 in accordance with yet another exemplary embodiment may determine that a corresponding battery cell is a pass when the calculated capacity increase value is greater than a predetermined reference capacity value and at the same time, the count number of full charge-complete discharge cycles in which the capacity value of the battery cell in each cycle derived by the capacity derivation unit 131 becomes equal to or less than the initial capacity (capacity (l)) of the battery cell derived after performing the initial full charge-complete discharge cycle is greater than a reference number of times.

In other words, a corresponding battery cell may be determined to be a pass only when the condition of the calculated capacity increase value AND the condition of the count number of full charge-complete discharge cycles in which the capacity value of the battery cell in each cycle derived by the capacity derivation unit 131 becomes equal to or less than an initial capacity (capacity (l)) of the battery cell derived after performing an initial full charge-complete discharge cycle are satisfied.

As a result, the battery cell pass determination apparatus in accordance with yet another exemplary embodiment may determine battery cell pass more accurately than the battery cell pass determination apparatus in accordance with an exemplary embodiment and the battery cell pass determination apparatus in accordance with another exemplary embodiment.

Meanwhile, the predetermined reference capacity value is described in the above description of the battery cell pass determination apparatus in accordance with an exemplary embodiment and the predetermined reference number of times is described in the above description of the battery cell pass determination apparatus in accordance with another exemplary embodiment, and thus, detailed descriptions thereof will be omitted.

2: Battery Cell Pass Determination Method in Accordance with Exemplary Embodiments

Figure 4:
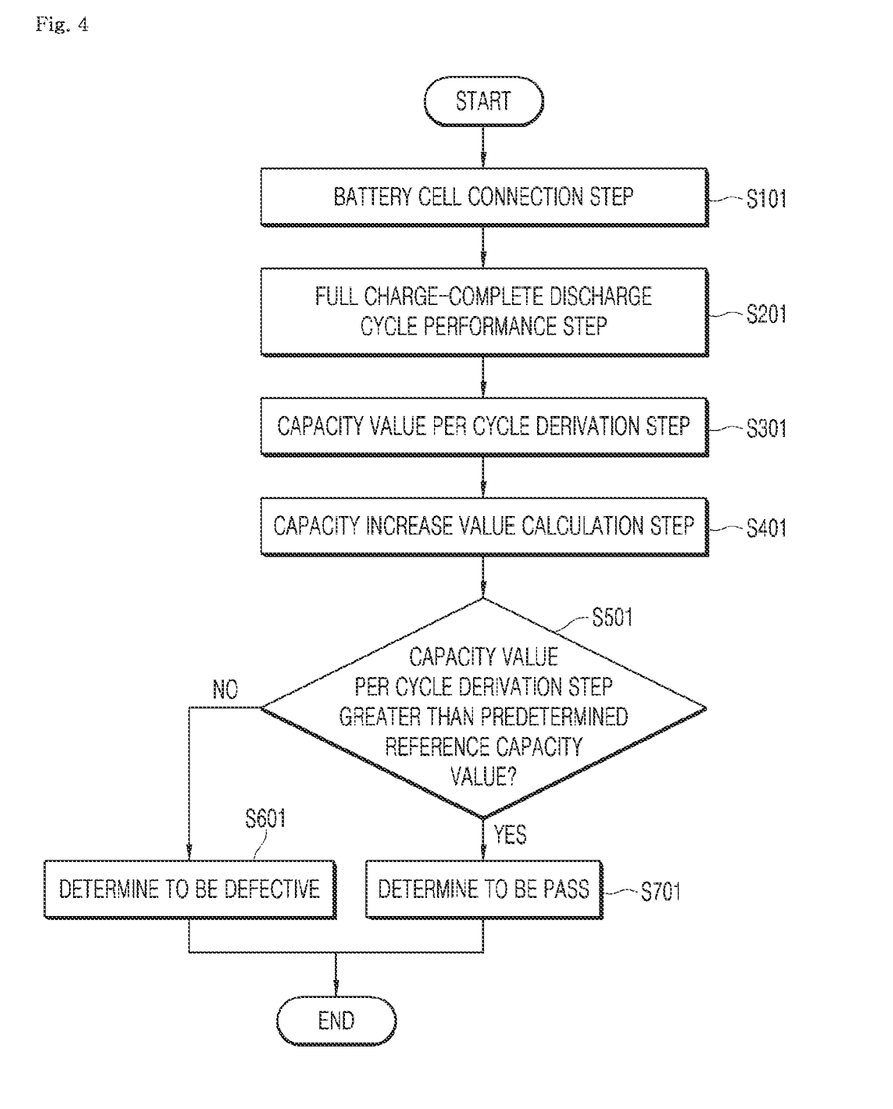
FIG. 4 is a flowchart showing a battery cell pass determination method in accordance with an exemplary embodiment.

2-1. Battery Cell Pass Determination Method in Accordance with an Exemplary Embodiment FIG. 4 is a flowchart showing a battery cell pass determination method in accordance with an exemplary embodiment.

Hereinafter, with reference to FIG. 4, the battery cell pass determination method in accordance with an exemplary embodiment will be described.

The battery cell pass determination method in accordance with an exemplary embodiment may include a battery cell connection step S101 of connecting a battery cell to be determined for battery cell pass to a battery cell pass determination apparatus, a full charge-complete discharge cycle performance step S201 of repeatedly performing a full charge-complete discharge cycle on the battery cell, a capacity value per cycle derivation step S301 of deriving a capacity value (capacity (t)) of the battery cell for each cycle while performing the full charge-complete discharge cycle, a capacity increase value calculation step S401 of calculating a capacity increase value from the derived capacity value for each cycle, and a judgment step S501 of judging battery cell pass on the basis of the calculated capacity increase value.

Specifically, the battery cell connection step S101 may be a procedure in which a battery cell to be determined for battery cell pass is fixed. For example, it may be a process of fixing the battery cell on an upper portion of a jig.

Meanwhile, the full charge-complete discharge cycle performance step may include a procedure in which a battery cell 10 is subjected to full charge→rest for a predetermined time→complete discharge→rest for a predetermined time.

At this time, in a full charge process or a complete discharge process, the battery cell 10 may be charged or discharged to 1 CP (Constant Power).

Meanwhile, in the capacity value per cycle derivation step S301, the capacity of a battery cell may be derived using various techniques known in the art.

For example, the capacity value derivation unit 131 may derive the capacity of a battery cell on the basis of the open voltage of the battery cell, or may derive the capacity of a battery cell by calculating the amount of current used in a full charge-complete discharge cycle.

Meanwhile, a capacity increase value calculated in the capacity increase value calculation step S401 may be calculated through the following equation.

$$\text{Capacity increase value} = \text{Capacity value per cycle (capacity}(t)) - \text{Initial capacity value (capacity}(l)) \quad \text{(Equation)}$$

That is, a capacity increase value may be calculated by subtracting an initial capacity value from a capacity value per cycle derived after performing each cycle.

Meanwhile, in the judgment step S501, when the calculated capacity increase value is greater than a predetermined reference capacity value, a corresponding battery cell may be determined to be a pass S701, and when the calculated capacity increase value is smaller than the predetermined reference capacity value, the corresponding battery cell may be determined to be defective S601.

Meanwhile, the predetermined reference capacity value may be a value corresponding to a predetermined reliability for a cell-pass capacity value after a predetermined full charge-complete discharge cycle is performed.

For example, when the predetermined reference capacity value is set to 1.006, it may correspond to a reliability of 77% when compared to determining battery cell pass for a battery cell on which a predetermined full charge-complete discharge cycle has been performed for 300 times.

Figure 5:
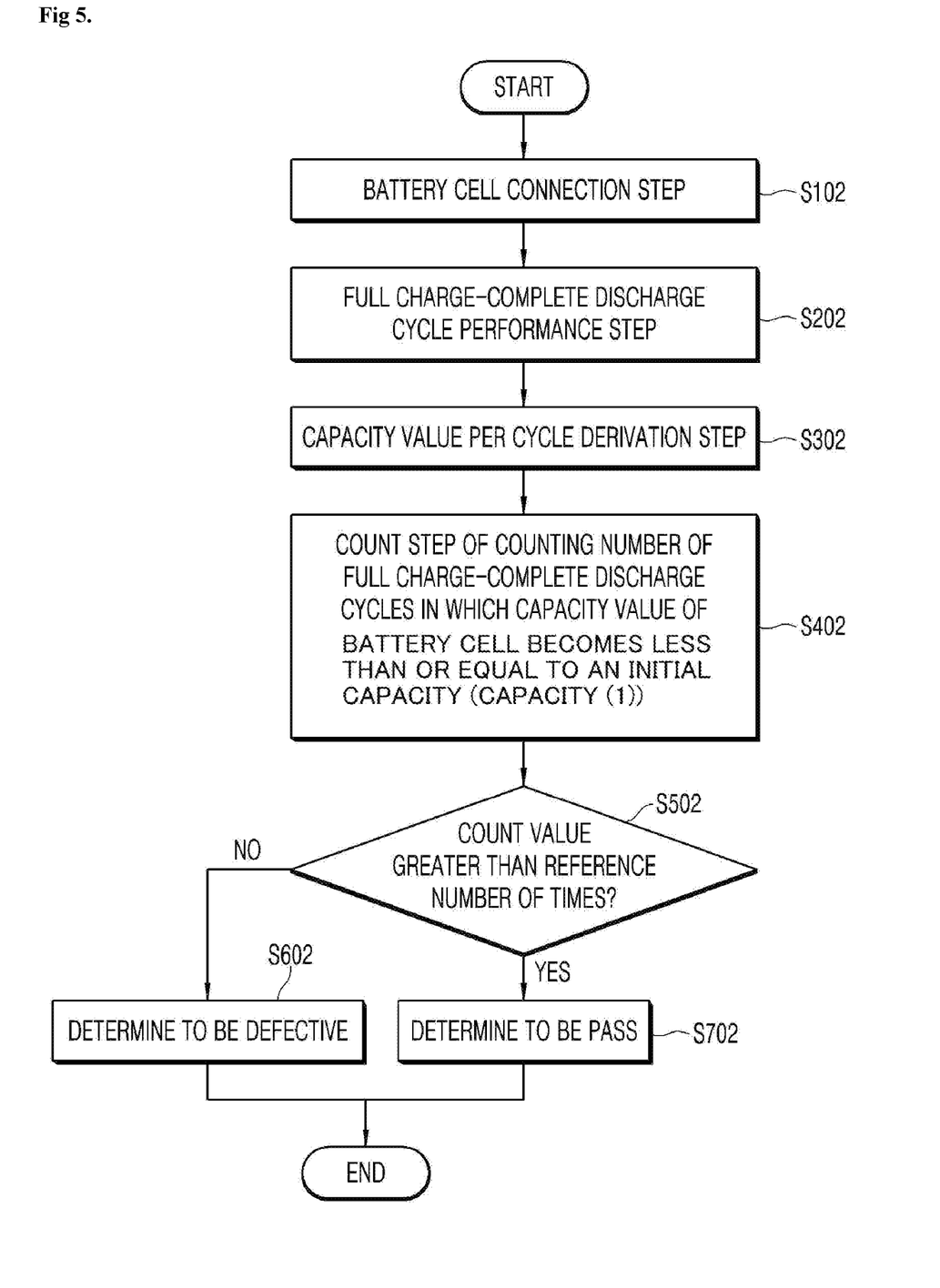
FIG. 5 is a flowchart showing a battery cell pass determination method in accordance with another exemplary embodiment.

2-2. Battery Cell Pass Determination Method in Accordance with Another Exemplary Embodiment FIG. 5 is a flowchart showing a battery cell pass determination method in accordance with another exemplary embodiment.

Hereinafter, with reference to FIG. 5, the battery cell pass determination method in accordance with another exemplary embodiment will be described.

The battery cell pass determination method in accordance with another exemplary embodiment may include a battery cell connection step S102 of connecting a battery cell to be determined for battery cell pass to a battery cell pass determination apparatus, a full charge-complete discharge cycle performance step S202 of repeatedly performing a full charge-complete discharge cycle on the battery cell, a capacity value per cycle derivation step S302 of deriving a capacity value (capacity (t)) of the battery cell for each cycle while performing the full charge-complete discharge cycle, a count step S402 of counting the number of full charge-complete discharge cycles in which the capacity value of the battery cell in each cycle derived from the capacity value per cycle derivation step S302 becomes equal to or less than an initial capacity (capacity (l)) of the battery cell derived after performing an initial full charge-complete discharge cycle, and a judgment step S502 of judging battery cell pass on the basis of a count number of full charge-complete discharge cycles in which the capacity value of the battery cell in each cycle derived from the capacity value per cycle derivation step S302 becomes equal to or less than the initial capacity (capacity (l)) of the battery cell derived after performing the initial full charge-complete discharge cycle.

Meanwhile, each of the battery cell connection step S102, the full charge-complete discharge cycle performance step S202, the capacity value per cycle derivation step S302 is respectively the same step as the battery cell connection step S101, the full charge-complete discharge cycle performance step S201, and the capacity value per cycle derivation step S301 of the battery cell pass determination method in accordance with an exemplary embodiment described above, and are described in the above description of the battery cell pass determination method in accordance with an exemplary embodiment, and thus, detailed descriptions thereof will be omitted.

Meanwhile, in the count step S402, it is possible to count the number of cycles in which the derived capacity value per cycle becomes an initial capacity value in a process of performing a full charge-complete discharge cycle.

Meanwhile, in the judgment step S502, when the count number of full charge-complete discharge cycles in which the capacity value of the battery cell in each cycle derived from the capacity value per cycle derivation step S301 becomes equal to or less than the initial capacity (capacity (l)) of the battery cell derived after performing the initial full charge-complete discharge cycle is greater than a reference number of times, a corresponding battery cell may be determined to be a pass S702, and when the count number of full charge-complete discharge cycles in which the capacity value of the battery cell in each cycle derived from the capacity value per cycle derivation step S301 becomes equal to or less than the initial capacity (capacity (l)) of the battery cell derived after performing the initial full charge-complete discharge cycle is less than or equal to the reference number of times, the corresponding battery cell may be determined to be defective S602.

At this time, the reference number of times may be a value corresponding to a predetermined reliability for a cell-pass capacity value after a predetermined full charge-complete discharge cycle is performed.

For example, when the reference number of times is set to 50, it may correspond to a reliability of 83% when compared to determining battery cell pass for a battery cell on which a predetermined full charge-complete discharge cycle has been performed for 300 times.

Figure 6:
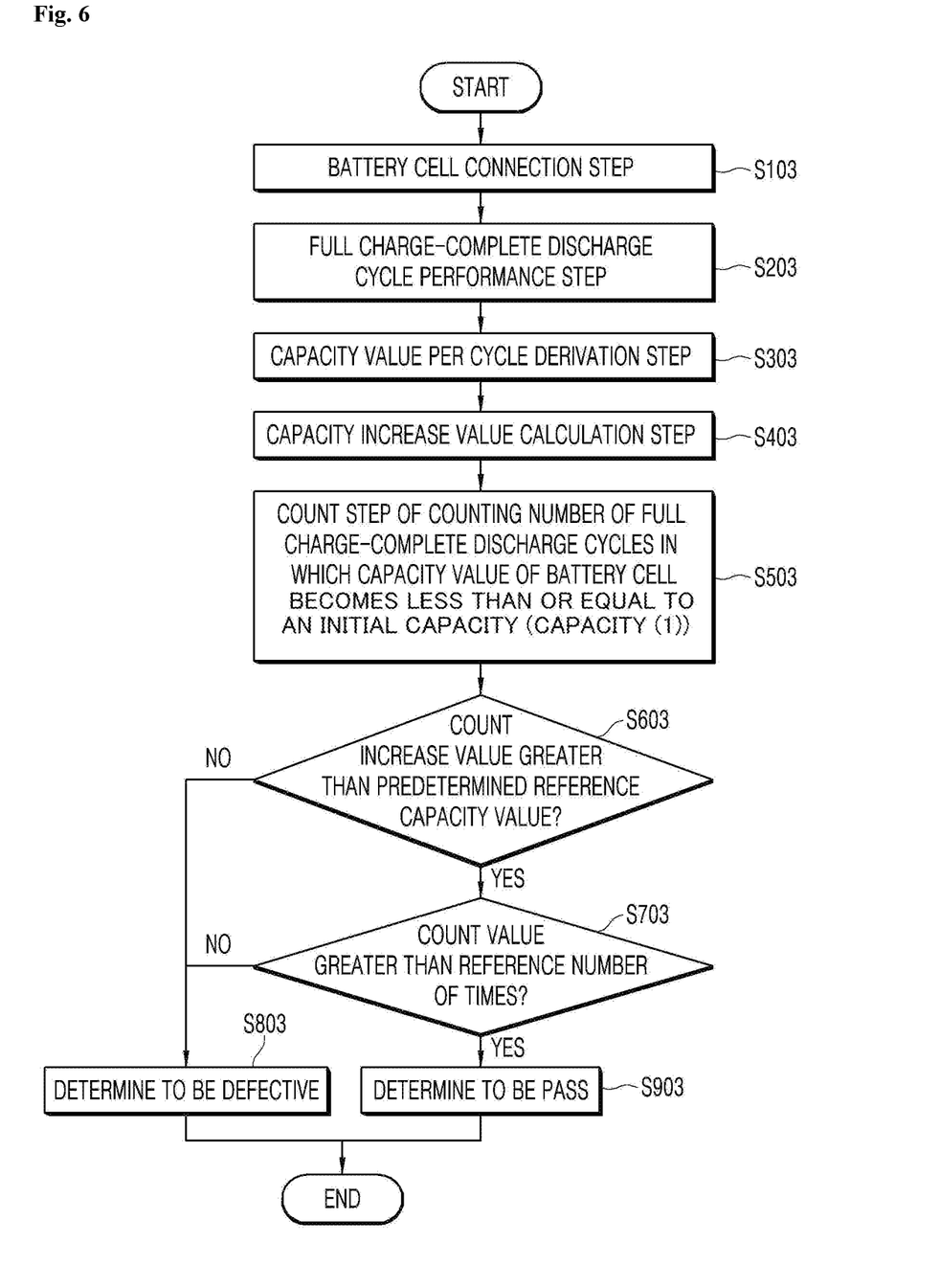
FIG. 6 is a flowchart showing a battery cell pass determination method in accordance with yet another exemplary embodiment.

2-3. Battery Cell Pass Determination Method in Accordance with Yet Another Exemplary Embodiment FIG. 6 is a flowchart showing a battery cell pass determination method in accordance with yet another exemplary embodiment.

Hereinafter, with reference to FIG. 6, the battery cell pass determination method in accordance with yet another exemplary embodiment will be described.

The battery cell pass determination method in accordance with yet another exemplary embodiment may include a battery cell connection step S103 of connecting a battery cell to be determined for battery cell pass to a battery cell pass determination apparatus, a full charge-complete discharge cycle performance step S203 of repeatedly performing a full charge-complete discharge cycle on the battery cell, a capacity value per cycle derivation step S303 of deriving a capacity value (capacity (t)) of the battery cell for each cycle while performing the full charge-complete discharge cycle, a capacity increase value calculation step S403 of calculating a capacity increase value from the derived capacity value per cycle, a count step S503 of counting the number of full charge-complete discharge cycles in which the capacity value of the battery cell in each cycle derived from the capacity value per cycle derivation step S303 becomes equal to or less than an initial capacity (capacity (l)) of the battery cell derived after performing an initial full charge-complete discharge cycle, and judgment steps S603 and S703 of judging battery cell pass on the basis of the calculated capacity increase value and a count number of full charge-complete discharge cycles in which the capacity value of the battery cell in each cycle derived from the capacity value per cycle derivation step S303 becomes equal to or less than the initial capacity (capacity (l)) of the battery cell derived after performing the initial full charge-complete discharge cycle.

Meanwhile, each of the battery cell connection step S103, the full charge-complete discharge cycle performance step S203, the capacity value per cycle derivation step S303 is respectively the same step as the battery cell connection step S101, the full charge-complete discharge cycle performance step S201, and the capacity value per cycle derivation step S301 of the battery cell pass determination method in accordance with an exemplary embodiment described above, and are described in the above description of the battery cell pass determination method in accordance with an exemplary embodiment, and thus, detailed descriptions thereof will be omitted.

In addition, the count step S503 is the same step as the count step S402 of the battery cell pass determination method in accordance with another exemplary embodiment described above, and is described in the above description of the battery cell pass determination method in accordance with another exemplary embodiment, and thus, a detailed description thereof will be omitted.

Meanwhile, in the judgment steps S603 and S703, when the calculated capacity increase value is greater than a predetermined reference capacity value and at the same time, the count number of full charge-complete discharge cycles is greater than a reference number of times, a corresponding battery cell may be determined to be a pass S903, and when any one of the two is smaller than a reference value, the battery cell may be determined to be defective S803.

In other words, a corresponding battery cell may be determined to be a pass only when the condition of the calculated capacity increase value AND the condition of the count number of full charge-complete discharge cycles in which the capacity value of the battery cell in each cycle derived from the capacity value per cycle derivation step S303 becomes equal to or less than an initial capacity (capacity (l)) of the battery cell derived after performing an initial full charge-complete discharge cycle are satisfied.

As a result, the battery cell pass determination method in accordance with yet another exemplary embodiment may determine battery cell pass more accurately than the battery cell pass determination method in accordance with an exemplary embodiment and the battery cell pass determination method in accordance with another exemplary embodiment.

Meanwhile, the predetermined reference capacity value is described in the above description of the battery cell pass determination method in accordance with an exemplary embodiment and the predetermined reference number of times is described in the above description of the battery cell pass determination method in accordance with another exemplary embodiment, and thus, detailed descriptions thereof will be omitted.

Meanwhile, although the technical spirit of the present invention has been described in detail according to the above embodiment, it should be noted that the above embodiment is for the description thereof, and is not intended to limit the same. In addition, those skilled in the art will understand that various embodiments are possible within the scope of the technical spirit of the present invention.

What is claimed is:

1. A battery cell pass determination apparatus comprising:
   a battery cell mounting part on which a battery cell to be determined for battery cell pass is mounted;
   a charge/discharge module which charges and discharges the battery cell; and
   a battery cell pass determination unit which determines whether the battery cell is a pass, wherein the battery cell pass determination unit includes:
   a capacity derivation unit which derives a capacity value (capacity (t)) of the battery cell for each cycle while performing a full charge-complete discharge cycle of the battery cell;
   a count unit which counts the number of full charge-complete discharge cycles in which the capacity value of the battery cell in each cycle derived by the capacity derivation unit becomes equal to or less than an initial capacity (capacity (l)) of the battery cell derived after performing an initial full charge-complete discharge cycle; and
   a judgment unit which judges battery cell pass on the basis of a count number of full charge-complete discharge cycles in which the capacity value of the battery cell in each cycle derived by the capacity derivation unit becomes equal to or less than the initial capacity (capacity (l)), wherein the judgment unit determines that the battery cell is the pass when the count number of full charge-complete discharge cycles in which the capacity value of the battery cell in each cycle derived by the capacity derivation unit becomes equal to or less than the initial capacity (capacity (l)) is greater than a reference number of times.

2. The battery cell pass determination apparatus of claim 1, wherein the reference number of times is a value corresponding to a predetermined reliability for a cell-pass capacity value after a predetermined full charge-complete discharge cycle is performed.

3. A battery cell pass determination apparatus comprising:
   a battery cell mounting part on which a battery cell to be determined for battery cell pass is mounted;

a charge/discharge module which charges and discharges the battery cell; and a battery cell pass determination unit which determines whether the battery cell is a pass, wherein the battery cell pass determination unit includes:

a capacity derivation unit which derives a capacity value (capacity (t)) of the battery cell for each cycle while performing a full charge-complete discharge cycle of the battery cell;

a capacity increase value calculation unit which calculates a capacity increase value from the derived capacity value for each cycle;

a count unit which counts the number of full charge-complete discharge cycles in which the capacity value of the battery cell in each cycle derived by the capacity derivation unit becomes equal to or less than an initial capacity (capacity (l)) of the battery cell derived after performing an initial full charge-complete discharge cycle; and a judgment unit which judges battery cell pass on the basis of the calculated capacity increase value and a count number of full charge-complete discharge cycles in which the capacity value of the battery cell in each cycle derived by the capacity derivation unit become equal to or less than the initial capacity (capacity (l)), wherein the judgment unit determines that the battery cell is the pass when the calculated capacity increase value is greater than a predetermined reference capacity value and at the same time, the count number of full charge-complete discharge cycles in which the capacity value of the battery cell in each cycle derived by the capacity derivation unit becomes equal to or less than the initial capacity (capacity (l)) is greater than a reference number of times.

4. The battery cell pass determination apparatus of claim 3, wherein the predetermined reference capacity value is a value corresponding to a predetermined reliability for a cell-pass capacity value after a predetermined full charge-complete discharge cycle is performed, and the reference number of times is a value corresponding to a predetermined reliability for a cell-pass capacity value after a predetermined full charge-complete discharge cycle is performed.

5. A method for determining battery cell pass, the method comprising:

a battery cell connection step of connecting a battery cell to be determined for battery cell pass to a battery cell pass determination apparatus;

a full charge-complete discharge cycle performance step of repeatedly performing a full charge-complete discharge cycle on the battery cell;

a capacity value per cycle derivation step of deriving a capacity value (capacity (t)) of a battery cell for each cycle while performing the full charge-complete discharge cycle;

a count step of counting the number of full charge-complete discharge cycles in which the capacity value of the battery cell in each cycle derived from the capacity value per cycle derivation step becomes equal to or less than an initial capacity (capacity (l)) of the battery cell derived after performing an initial full charge-complete discharge cycle; and a judgment step of judging battery cell pass on the basis of a count number of full charge-complete discharge cycles in which the capacity value of the battery cell in each cycle derived from the capacity value per cycle derivation step becomes equal to or less than the initial capacity (capacity (l)) of the battery cell derived after performing the initial full charge-complete discharge cycle, wherein the judgment step determines that the battery cell is the pass when the count number of full charge-complete discharge cycles in which the capacity value of the battery cell in each cycle derived from the capacity value per cycle derivation step becomes equal to or less than the initial capacity (capacity (l)) of the battery cell derived after performing the initial full charge-complete discharge cycle is greater than a reference number of times.

6. The method of claim 5, wherein the reference number of times is a value corresponding to a predetermined reliability for a cell-pass capacity value after a predetermined full charge-complete discharge cycle is performed.

7. A method for determining battery cell pass, the method comprising:

a battery cell connection step of connecting a battery cell to be determined for battery cell pass to a battery cell pass determination apparatus;

a full charge-complete discharge cycle performance step of repeatedly performing a full charge-complete discharge cycle on the battery cell;

a capacity value per cycle derivation step of deriving a capacity value (capacity (t)) of a battery cell for each cycle while performing the full charge-complete discharge cycle;

a capacity increase value calculation step of calculating a capacity increase value from the derived capacity value per cycle; and a count step of counting the number of full charge-complete discharge cycles in which the capacity value of the battery cell in each cycle derived from the capacity value per cycle derivation step becomes equal to or less than an initial capacity (capacity (l)) of the battery cell derived after performing an initial full charge-complete discharge cycle; and a judgment step of judging battery cell pass on the basis of the calculated capacity increase value and a count number of full charge-complete discharge cycles in which the capacity value of the battery cell in each cycle derived from the capacity value per cycle derivation step becomes equal to or less than the initial capacity (capacity (l)) of the battery cell derived after performing the initial full charge-complete discharge cycle, wherein the judgment step determines that the battery cell is the pass when the calculated capacity increase value is greater than a predetermined reference capacity value and at the same time, the count number of full charge-complete discharge cycles in which the capacity value of the battery cell in each cycle derived from the capacity value per cycle derivation step becomes equal to or less than the initial capacity (capacity (l)) of the battery cell derived after performing the initial full charge-complete discharge cycle is greater than a reference number of times.

8. The method of claim 7, wherein the predetermined reference capacity value is a value corresponding to a predetermined reliability for a cell-pass capacity value after a predetermined full charge-complete discharge cycle is performed, and the reference number of times is a value corresponding to a predetermined reliability for a cell-pass capacity value after a predetermined full charge-complete discharge cycle is performed.

* * * * *